United States Patent
Dalla Piazza et al.

(10) Patent No.: US 7,843,115 B2
(45) Date of Patent: Nov. 30, 2010

(54) ELECTRONIC COMPONENT HAVING A RESONATOR ELEMENT ARRANGED IN AN HERMETICALLY CLOSED HOUSING AND METHOD FOR MANUFACTURING SUCH AN ELECTRONIC COMPONENT

(75) Inventors: Silvio Dalla Piazza, St-Imier (CH); Thomas Lüthi, Grenchen (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 880 days.

(21) Appl. No.: 10/596,033

(22) PCT Filed: Nov. 16, 2004

(86) PCT No.: PCT/EP2004/012949

§ 371 (c)(1),
(2), (4) Date: May 25, 2006

(87) PCT Pub. No.: WO2005/055422

PCT Pub. Date: Jun. 16, 2005

(65) Prior Publication Data

US 2008/0309202 A1 Dec. 18, 2008

(30) Foreign Application Priority Data

Nov. 25, 2003 (EP) .................................. 03027066

(51) Int. Cl.
*H01L 41/053* (2006.01)
(52) U.S. Cl. ...................................... 310/344; 310/348
(58) Field of Classification Search .................. 310/340, 310/344, 348
See application file for complete search history.

(56) References Cited

U.S. PATENT DOCUMENTS 3,766,616 A   10/1973   Staudte (Continued)

FOREIGN PATENT DOCUMENTS

| EP | 1 111 770 A1 | 6/2001 |
| EP | 1 303 042 A1 | 4/2003 |
| JP | 54-35870 | 3/1979 |
| JP | 08-316732 | * 11/1996 |
| JP | 11145769 | 5/1999 |

OTHER PUBLICATIONS

International Search Report issued in corresponding application No. PCT/EP2004/012949 completed Apr. 22, 2005 and mailed Apr. 29, 2005.

*Primary Examiner*—Walter Benson
*Assistant Examiner*—Derek J Rosenau
(74) *Attorney, Agent, or Firm*—Griffin & Szipl, P.C.

(57) ABSTRACT

The electronic component includes at least one resonator element arranged in a housing of a case. The case includes a main part with a base and at least one lateral wall of annular shape, and a cover fixed onto the main part to hermetically seal the housing of the case. One portion of the cover is transparent to a determined wavelength of a light beam to allow the resonator element to be optically adjusted once the case is sealed. The cover is fixed onto a rim of the lateral wall of the main part, which is preferably made of a ceramic material, such that one part of the rim preferably surrounds the entire lateral surface of the cover to ensure protection of the electronic component against lateral shocks.

14 Claims, 1 Drawing Sheet

U.S. PATENT DOCUMENTS

| | | |
|---|---|---|
| 4,191,905 A | 3/1980 | Yasuda et al. |
| 5,841,217 A * | 11/1998 | Kizaki et al. ................. 310/348 |
| 5,949,294 A * | 9/1999 | Kondo et al. .................. 331/68 |
| 6,456,168 B1 * | 9/2002 | Luff ............................ 331/68 |
| 2002/0113523 A1 | 8/2002 | Endoh |
| 2003/0168944 A1 * | 9/2003 | Shimizu et al. ............. 310/344 |

* cited by examiner

ELECTRONIC COMPONENT HAVING A RESONATOR ELEMENT ARRANGED IN AN HERMETICALLY CLOSED HOUSING AND METHOD FOR MANUFACTURING SUCH AN ELECTRONIC COMPONENT

This is a National Phase Application in the United States of International Patent Application PCT/EP2004/012949, filed Nov. 16, 2004, which claims priority on European Patent Application No. 03027066.4, filed Nov. 25, 2003. The entire disclosures of the above patent applications are hereby incorporated by reference.

FIELD OF THE INVENTION

The present invention concerns an electronic component having a resonator element in a hermetically sealed or closed case. Said case includes a main part with a base and at least one side wall of annular shape, and a cover fixed onto the main part. At least one portion of the cover is transparent to a determined wavelength of a light beam to allow the resonator element to be optically adjusted.

The invention also concerns a method of manufacturing an electronic component. The method includes the steps of making the main part of the case by stacking and securing sheets of hard material, such as ceramic material, and mounting a resonator element in a housing of the case prior to closing the case with a cover. The sheets are worked to define a base and at least one side wall.

BACKGROUND OF THE INVENTION

The resonator element can be for example a piezoelectric resonator, such as a quartz resonator to be connected to an oscillator circuit. Most quartz resonators of small dimensions, which are used for example in electronic or electromechanical watches, are quartz tuning fork resonators. These quartz resonators are usually enclosed in cases in vacuum, in the case of generating low frequency signals supplied by the oscillator circuit, or in an inert gas atmosphere.

Generally, such resonators are mounted in ceramic cases for example, which are relatively flat. These cases generally include a main part of parallelepipedic shape inside which a resonator is mounted, and a rectangular cover fixed onto the main part. If the resonator is enclosed in vacuum in the case, said resonator can be adjusted optically through the transparent cover.

In this connection, JP Utility Model No. 54-35870 can be cited, which discloses an electronic component with a resonator element, which is arranged in a first housing of a main part of a case. This first housing is hermetically sealed by a transparent cover fixed using a preform on an annular edge of the first housing of the main part. An integrated oscillator circuit is arranged in a second housing of the main part of the case, which is separated from the first housing by a base. The second housing is closed by an opaque cover fixed onto an annular edge of the second housing of the main part. The integrated circuit is electrically connected to the resonator element through the base of the main part of the case.

One drawback of such an electronic component disclosed in JP Utility Model No. 54-35870 is that, in the event of lateral shocks on each cover, cracks can occur in the cover or the material fixing the cover onto the main part, thus inducing a loss of sealing. These lateral shocks can occur during various manipulations, particularly during operations for assembling said electronic component in an electronic apparatus or on a printed circuit board. As the resonator element usually has to remain enclosed in vacuum in its case or in an inert gas atmosphere, the adjustment of the resonator element to generate signals of a determined frequency from the oscillator circuit may be impaired. The resonator can even stop oscillating. In order to minimise these problems, the corners and side faces of the covers have to be ground in accordance with special processes. Of course, this substantially increases the cost of such covers.

Another drawback of the electronic component of JP Utility Model No. 54-35870 is solely connected to the sealing method. Indeed, the technique commonly employed for sealing the case is to stack the various elements in a cavity of a metal plate, namely the preform on the main part of the case, and the cover on the preform. Thus, the three elements are accurately positioned. In order to do this, the mechanical tolerance of the cavity has to be very high so as to position the three elements properly.

It is thus a main object of the invention to overcome the drawbacks of the prior art by providing an electronic component having a resonator element hermetically enclosed in a case whose cover is protected from lateral shocks. Moreover, the manufacturing time and costs for such an electronic component with a protected case cover can be minimized.

SUMMARY OF THE INVENTION

The invention therefore concerns an electronic component cited hereinbefore which is characterized in that the cover is fixed onto a rim of the lateral wall of the main part, which is made of a hard material, such as a ceramic material, such that a part of the rim at least partially surrounds the lateral surface of the cover in order to ensure protection of the electronic component against lateral shocks.

One advantage of the electronic component according to the invention is that with such a rim or flange, one part of which partially surrounds the lateral surface of the cover to protect it from lateral shocks, the electronic component can be handled without any risk. Preferably, one portion of the rim completely surrounds the lateral surface of the cover. This allows the resonator element to be kept hermetically enclosed in its housing by the cover in an inert gas atmosphere or preferably in vacuum. Likewise, the positioning of the cover with respect to the main part of the case no longer depends on the mechanical tolerance of cavities used in the method for closing the case. This thus reduces the risk of poor alignment of the cover on the rim.

The height of the part of the rim which surrounds the lateral surface of the cover is preferably equal to or greater than the thickness of the cover fixed onto a rim shoulder, so that no edge of the cover projects from the upper face of the rim. A space can also be left between this part of the rim and the lateral surface of the cover to ensure better protection. In this way, lateral shocks occurring against the rim do not directly propagate on the cover. Thus, a transparent cover, for example of glass, can be used, obtained simply by scribing and breaking a conventional sheet of glass. This reduces the manufacturing costs of such an electronic component, since it is no longer necessary to work in a special manner the edges and angles of the cover made of glass or another material that may be friable or breakable.

In order to secure the cover to the rim, a first annular layer of gold plating is first of all deposited on the rim, as well as a second annular layer of gold plating deposited at the periphery of an inner face of the cover. A preform of a metal alloy is arranged between the two annular layers of gold plating to weld the cover by heating and pressing the cover against the rim. The metal alloy of the preform used can be composed of tin and gold.

If the resonator element has to be enclosed in vacuum, a getter type material, such as a layer of titanium or chromium, can be evaporated in the housing. After having hermetically sealed the resonator element housing, the layer of chromium or titanium can be activated particularly heated by a laser beam to act as a vacuum pump.

The invention therefore also concerns a method of manufacturing the aforecited component, which is characterized in that the method includes a second series of steps of placing the cover on the rim of the main part, one part of which surrounds the lateral surface of the cover, said cover being positioned on the rim by the part of the rim surrounding the lateral surface of the cover, and fixing the cover onto the rim by heating metal layers arranged on the rim and the cover.

BRIEF DESCRIPTION OF THE DRAWINGS

The objects, advantages and features of the electronic component having a resonator element, and its manufacturing method, will appear more clearly in the following description of at least one non-limiting embodiment of the invention in conjunction with the drawings, in which.

DETAILED DESCRIPTION OF THE
ILLUSTRATIVE EMBODIMENTS

In the following description, none of the parts of the electronic component, which are well known to those skilled in this technical field, will be described in detail here.

Figure 1:
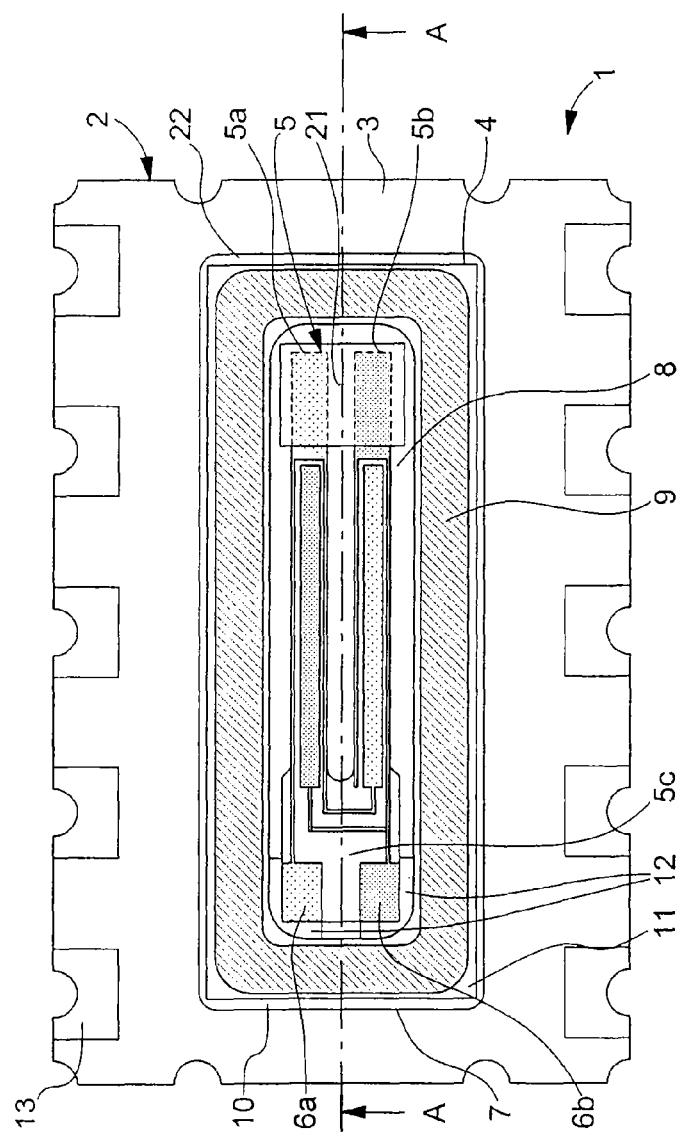
FIG. 1 shows a top view of the electronic component according to the invention.
Figure 2:
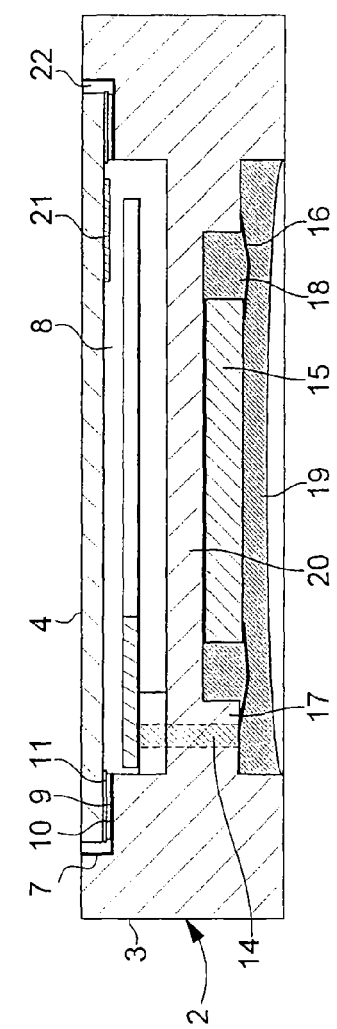
FIG. 2 shows a cross-section along the line A-A of FIG. 1 of the electronic component according to the invention.

Electronic component 1 is shown in a simplified manner in FIGS. 1 and 2. It includes a resonator element 5 mounted in a first housing 8 of a case of parallelepipedic form. The case includes a main part 2 with a lateral wall of annular shape 3 and a base 20, and a cover 4 fixed onto a shoulder of a rim 7 of lateral wall 3 to hermetically seal in vacuum housing 8 of the main part. This case can be for example 5 mm long, 3.2 mm wide and 1.08 mm high.

It's to be noted that the rim 7 defines an upper part of the lateral wall 3 with a shoulder on which the cover 4 is fixed.

Lateral wall 3, and base 20 of main part 2 of the case are preferably made of ceramic material in accordance with a conventional technique. In order to do this, several ceramic sheets are normally worked, stacked and fixed on top of each other to make base 20 and lateral wall 3 above and below the base.

A part of rim 7 entirely surrounds the cover of rectangular shape so as to protect it from any lateral shocks affecting the electronic component. The height of the part of rim 7 which surrounds cover 4 is greater than or equal to the thickness of the cover once fixed to said rim. In this way, no edge of the cover projects outside the case.

Owing to this rim 7 of main part 2, the electronic component can be handled without any risk. A space 22 separates the lateral surface of cover 4 of the part of rim 7 that surrounds it. The space can be of smaller dimensions than the thickness of the cover. This space 22 prevents any lateral shocks that may occur against said rim and which are capable of damaging the cover, from directly propagating to the cover.

Cover 4 of rectangular shape can advantageously be a glass cover, which is obtained simply by scribing and breaking a conventional sheet of glass. Since the cover is protected by a part of rim 7, it is no longer necessary to work the edges and corners of the cover in a special way, which reduces the manufacturing costs of such an electronic component.

In order to fix cover 4 on rim 7, a first annular layer of gold plating 10 is deposited by evaporation, or by another method, on the inner side of rim 7, in particular on the shoulder, and a second annular layer of gold plating 11 is deposited by evaporation or another method, on the periphery of an inner face of cover 4. This second annular layer 11 is not shown in FIG. 1 to avoid overloading the drawing. An annular metal alloy preform 9 is deposited between the two annular layers of gold plating 10 and 11 in order to be able to weld cover 4 onto the shoulder of the rim 7 by vacuum heating and pressing cover 4 against rim 7. This preform is for example made of an eutectic alloy of gold and tin so as to have a melting temperature higher than the temperature used in the subsequent processes for assembling electronic component 1.

Resonator element 5, enclosed in vacuum in housing 8 of main part 2, is preferably a piezoelectric resonator, which includes a quartz tuning fork. This conventional quartz tuning fork is formed of two parallel arms 5a and 5b to vibrate in bending mode, which are held on their base by a bridge 5c. Layers of metallisation are deposited on each arm 5a and 5b and on bridge 5c to form two groups of electrodes 6a and 6b so as to subject them to electrical fields capable of vibrating said arms 5a and 5b. Bridge 5c is fixed in a corner of housing 8 on two studs 12 integral with base 20 and lateral wall 3 to leave a space for arms 5a and 5b to vibrate in housing 8 between base 20 and cover 4.

For further details as to the embodiment or operation of such a resonator, the reader may refer to the teaching drawn from EP Patent Application Nos. 1 111 770 A1 and 1 303 042 A1.

The adjustment or setting of the quartz resonator is carried out in a conventional manner on the finished product, i.e. when the cover hermetically seals housing 8 of the case under vacuum. For this adjustment, cover 4 includes at least one portion transparent to a determined wavelength of a light beam, such as a laser beam. This cover can preferably be made of glass as described hereinbefore, or also of silicon, which is transparent to wavelengths greater than 1.3 µm. The laser beam used in this case has a wavelength equal to or greater than 1.3 µm.

In the embodiment shown in FIGS. 1 and 2, electronic component 1 further includes a second housing 18 in main part 2, which is delimited by lateral wall 3 and base 20. This second housing 18 is arranged on an opposite face of the base to housing 8 of resonator element 5. An integrated circuit 15 having a stage oscillator is fixed onto base 20 in second housing 18.

Several metal pads of oscillator circuit 15, which are not shown, are connected in a known manner by metal wires 16 to inner metal pads of the case. These inner metal pads of the case, which are not shown, are arranged on an annular support 17 integral with lateral wall 3 and base 20. These inner metal pads are connected by connection paths, which are not shown, to external connection pads 13 arranged on both sides of electronic component 1.

Second housing 18 is filled with a resin 19 to encapsulate integrated circuit 15 so as to protect it mechanically and from light. In this manner, the finished electronic component 1 is configured like an SMD ("surface mounting device") type component so that it can be mounted for example on a printed circuit board.

Oscillator circuit 15 is also connected to quartz resonator 5 through base 20 by two connection paths 14 so as to produce signals at a frequency dependent on the resonator setting. These connection paths can be made of tungsten-nickel-gold.

In order to generate low frequency signals, quartz resonator 5 has to be vacuum enclosed in housing 8 so as to be adjusted or set on the finished electronic component by a laser beam as described hereinbefore. However, a residual pressure may remain in housing 8 of the order of 1 mbar. Consequently, a layer of chromium or titanium 21 can be deposited for example on a part of the inner face of cover 4 as getter type material. This chromium or titanium layer 21 can act as a vacuum pump when it is activated particularly by a laser beam through cover 4.

By activating this layer 21 by laser beam, particles of evaporated chromium or titanium can be deposited on the resonator and thus lower the oscillation frequency. Afterwards, it is possible to increase the frequency of the resonator to be adjusted by acting directly on the electrodes of the resonator.

It should be noted that this layer of chromium or titanium 21 could be deposited over the entire inner face of cover 4 acting as a primer layer for the gold plating layer 11. Moreover, the layer of chromium or titanium can also be placed at another location in housing 8, for example on base 20 or on resonator 5 provided that it is possible to activate it by a laser beam through cover 4 of the component.

From the description that has just been given, multiple variants of the electronic component can be designed by those skilled in the art without departing from the scope of the invention defined by the claims. The electronic component may include only the resonator element.

One could also envisage mounting the oscillator circuit in the same housing as the quartz resonator. This oscillator circuit can also include a real time clock function (RTC) or other functions.

One could also envisage mounting the resonator element in cases whose main part can be made of metal or glass, as has already been proposed for conventional tuning fork resonators. In such case, the part of the rim may only partially surround the lateral wall of the cover for example the four corners of the cover.

The resonator element can be adjusted prior to fixing the cover onto the rim of the lateral wall of the case. Finally, the housing including the resonator element can contain no getter type material.

The invention claimed is:

1. An electronic component comprising at least one resonator element arranged in a first housing of a case, the case comprising:
   (a) a main part provided with a base and at least one lateral wall of annular shape; and
   (b) a glass cover fixed onto the main part to hermetically seal the first housing of the case, wherein at least one portion of the glass cover is transparent to a determined wavelength of a light beam to allow the resonator element to be optically adjusted, wherein the glass cover is friable or breakable,
   wherein the glass cover is fixed onto an annular rim of the lateral wall of the main part, wherein the main part is made of a hard material so that one part of the rim entirely surrounds lateral surfaces of the glass cover and ensures protection of the glass cover of the electronic component against lateral shocks, and
   wherein a space is provided between all the lateral surfaces of the glass cover and the one part of the rim surrounding the glass cover, wherein the space is substantially of smaller dimension than the thickness of the glass cover in order to facilitate mounting of the glass cover on the rim of the lateral wall of the main part,
   wherein the lateral surfaces of the glass cover comprise edges and corners, and the space provided between all the lateral surfaces of the glass cover and the one part of the rim surrounding the glass cover narrows at the corners of the glass cover, and
   wherein the space is disposed to avoid propagation on the glass cover of lateral shock against the rim.

2. The electronic component according to claim 1, wherein the hard material is a ceramic material.

3. The electronic component according to claim 1, wherein a height of the one part of the rim surrounding the lateral surfaces of the glass cover is larger than or equal to a thickness of the glass cover fixed onto the rim.

4. The electronic component according to claim 1, wherein the rim of the main part of the case receiving the glass cover includes a first annular layer of gold plating, wherein a periphery of an inner face of the glass cover includes a second annular layer of gold plating, and wherein the glass cover is welded onto the rim using a metal alloy preform arranged between the first annular layer of gold plating and the second annular layer of gold plating, wherein the metal alloy is formed of tin and gold.

5. The electronic component according to claim 1, wherein the first housing of the main part of the case that includes the resonator element is vacuum sealed, wherein the resonator element is a quartz resonator adjustable by a laser beam through the transparent portion of the glass cover, and said quartz resonator comprises a tuning fork with two parallel arms connected to each other by a bridge and carrying electrodes to make the arms vibrate, and wherein the main part of the case further includes at least one stud secured to the base onto which the tuning fork is fixed, and said electrodes are electrically connected through the main part of the case to external connection terminals.

6. The electronic component according to claim 1, further comprising an oscillator circuit electrically connected to the resonator element.

7. The electronic component according to claim 6, wherein the oscillator circuit is arranged in a second housing of the main part, wherein the second housing is delimited by the lateral wall and the base, and the second housing is arranged on an opposite face of the base to the first housing of the resonator element, wherein said oscillator circuit is encapsulated in the second housing by a resin and is electrically connected to external connection terminals of the electronic component, and wherein the base of the main part of the case includes electrical connection paths for electrically connecting the oscillator circuit and the resonator element.

8. The electronic component according to claim 1, wherein a getter type material is arranged in the first housing of the resonator element to act as a vacuum pump when activated.

9. The electronic component according to claim 8, wherein the getter type material is a layer of evaporated titanium or chromium in the first housing of the resonator element, and wherein this layer of titanium or chromium is disposed to be activated by means of a laser beam through the transparent portion of the glass cover so as to act as a vacuum pump and lower the oscillation frequency of the resonator element.

10. The electronic component according to claim 9, wherein the getter type material layer is disposed on a part of the inner face of the glass cover.

11. The electronic component according to claim 1, further comprising an integrated circuit arranged in a second housing of the case, wherein the second housing is delimited by the lateral wall and the base of the main part, and wherein the at least one resonator element is vacuum enclosed in the first housing, and the second housing is filled with resin encapsulating the integrated circuit.

12. An electronic component comprising at least one resonator element arranged in a first housing of a case, the case comprising:
  (a) a main part provided with a base and at least one lateral wall of annular shape; and
  (b) a glass cover fixed onto the main part to hermetically seal the first housing of the case, wherein at least one portion of the glass cover is transparent to a determined wavelength of a light beam to allow the resonator element to be optically adjusted, wherein the glass cover is friable or breakable,
  wherein the glass cover is fixed onto an annular rim of the lateral wall of the main part, wherein the main part is made of a hard material so that one part of the rim surrounds at least certain portions of lateral surfaces of the glass cover and ensures protection of the glass cover of the electronic component against lateral shocks, and
  wherein a height of the one part of the rim surrounding all the lateral surfaces of the glass cover is larger than or equal to a thickness of the glass cover fixed onto the rim, and wherein the one part of the rim entirely surrounds the lateral surfaces of the glass cover, and
  wherein the lateral surfaces of the glass cover comprise edges and corners, and the space provided between all the lateral surfaces of the glass cover and the one part of the rim surrounding the glass cover narrows at the corners of the glass cover.

13. The electronic component according to claim 12, further comprising an integrated circuit arranged in a second housing of the case, wherein the second housing is delimited by the lateral wall and the base of the main part, and wherein the at least one resonator element is vacuum enclosed in the first housing, and the second housing is filled with resin encapsulating the integrated circuit.

14. An electronic component comprising at least one resonator element arranged in a first housing of a case, the case comprising:
  (a) a main part provided with a base and at least one lateral wall of annular shape; and
  (b) a glass cover fixed onto the main part to hermetically seal the first housing of the case, wherein at least one portion of the glass cover is transparent to a determined wavelength of a light beam to allow the resonator element to be optically adjusted, wherein the glass cover is friable or breakable,
  wherein the glass cover is fixed onto an annular rim of the lateral wall of the main part, wherein the main part is made of a hard material so that one part of the rim surrounds at least certain portions of lateral surfaces of the glass cover and ensures protection of the glass cover of the electronic component against lateral shocks, and
  wherein a height of the one part of the rim surrounding all the lateral surfaces of the glass cover is larger than or equal to a thickness of the glass cover fixed onto the rim, and wherein the one part of the rim entirely surrounds the lateral surfaces of the glass cover,
  wherein a space is provided between the lateral surfaces of the glass cover and the one part of the rim surrounding the glass cover, wherein the space is substantially of smaller dimensions than the thickness of the glass cover in order to facilitate mounting of the glass cover on the rim of the lateral wall of the main part,
  wherein the lateral surfaces of the glass cover comprise edges and corners, and the space provided between all the lateral surfaces of the glass cover and the one part of the rim surrounding the glass cover narrows at the corners of the glass cover, and
  wherein the space is disposed to avoid propagation on the glass cover of lateral shock against the rim.

* * * * *